United States Patent
Jin et al.

(10) Patent No.: US 10,476,448 B1
(45) Date of Patent: Nov. 12, 2019

(54) DIGITAL PRE-DISTORTION FOR AN AMPLIFIER

(71) Applicant: Cisco Technology, Inc., San Jose, CA (US)

(72) Inventors: Hang Jin, Plano, TX (US); John T. Chapman, Coto de Caza, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/956,858

(22) Filed: Apr. 19, 2018

(51) Int. Cl.
| H04K 1/02 | (2006.01) |
| H04L 25/03 | (2006.01) |
| H04L 25/49 | (2006.01) |
| H03F 1/32 | (2006.01) |
| H03F 3/24 | (2006.01) |
| H04L 12/28 | (2006.01) |
| H04B 1/04 | (2006.01) |

(52) U.S. Cl.
CPC .............. *H03F 1/3247* (2013.01); *H03F 3/24* (2013.01); *H03F 2201/3233* (2013.01); *H04B 1/0475* (2013.01); *H04B 2001/0425* (2013.01); *H04L 12/2801* (2013.01)

(58) Field of Classification Search
CPC .. H03F 1/3247; H03F 3/24; H03F 2201/3233; H04L 12/2801; H04B 2001/0425; H04B 1/0475; H04J 3/0638
USPC .......................... 375/296, 297, 354; 330/149
See application file for complete search history.

(56) References Cited

U.S. PATENT DOCUMENTS

| 2013/0243136 A1* | 9/2013 | Kolze ................... H04J 3/0638 375/354 |
| 2014/0292405 A1* | 10/2014 | Takano ................. H03F 1/3247 330/149 |

* cited by examiner

*Primary Examiner* — Phuong Phu
(74) *Attorney, Agent, or Firm* — Merchant & Gould P.C.

(57) ABSTRACT

Digital pre-distortion may be provided. First, a characterization for input matching circuitry may be determined. Next, a characterization for non-linearity of an amplifier connected to the input matching circuitry may be determined. Then, a distortion correcting signal may be generated from an input signal based on the determined characterization for the input matching circuitry and the determined characterization for the non-linearity of the amplifier. The generated distortion correcting signal may then be provided to the input matching circuitry.

17 Claims, 5 Drawing Sheets

US 10,476,448 B1

DIGITAL PRE-DISTORTION FOR AN AMPLIFIER

TECHNICAL FIELD

The present disclosure relates generally to distortion correction.

BACKGROUND

A Hybrid Fiber-Coaxial (HFC) network is a broadband network that combines optical fiber and coaxial cable. It has been commonly employed globally by cable television operators. In a hybrid fiber-coaxial cable network, television channels are sent from a cable system's distribution facility to local communities through optical fiber trunk lines. At the local community, a box translates the signal from a light beam to electrical signal, and sends it over cable lines for distribution to subscriber residences. The optical fiber trunk lines provide adequate bandwidth to allow future expansion and new bandwidth-intensive services.

BRIEF DESCRIPTION OF THE FIGURES

The accompanying drawings, which are incorporated in and constitute a part of this disclosure, illustrate various embodiments of the present disclosure. In the drawings.

DETAILED DESCRIPTION

Overview

Figure 1:
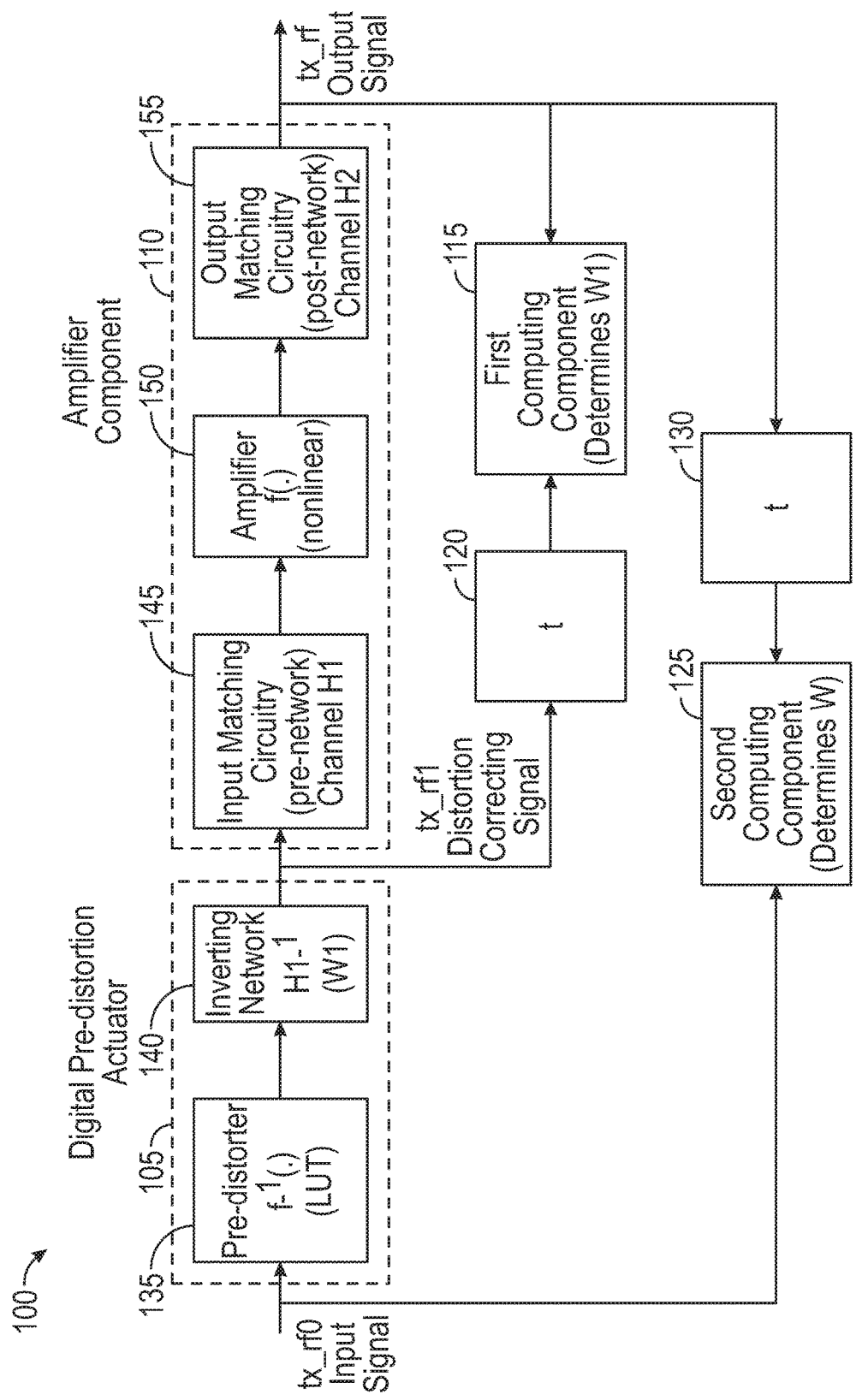
FIG. 1 is a block diagram of a digital pre-distortion system.

Digital pre-distortion may be provided. First, a characterization for input matching circuitry may be determined. Next, a characterization for non-linearity of an amplifier connected to the input matching circuitry may be determined. Then, a distortion correcting signal may be generated from an input signal based on the determined characterization for the input matching circuitry and the determined characterization for the non-linearity of the amplifier. The generated distortion correcting signal may then be provided to the input matching circuitry.

Both the foregoing overview and the following example embodiments are examples and explanatory only, and should not be considered to restrict the disclosure's scope, as described and claimed. Furthermore, features and/or variations may be provided in addition to those described. For example, embodiments of the disclosure may be directed to various feature combinations and sub-combinations described in the example embodiments.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Multiple-system operators (MSOs) are operators of multiple cable or direct-broadcast satellite television systems. These systems may include HFC networks. To amplify upstream (US) signals and downstream (DS) signals in the HFC network, MSOs may use nodes deployed within the HFC. In the HFC network, a node may comprise a container that may house optical and electrical circuitry. An optical fiber cable or a coaxial cable may be connected to an US side of the node and a plurality of coaxial cables may be connected to a DS side of the node. The US side of the node may be connect to a headend in the HFC network and the DS side of the node may be connected to Customer Premises Equipment (CPE) of subscribers to the HFC. An amplifier may be used in the node to amplify upstream (US) signals and downstream (DS) signals.

The amplifier used in conventional systems may have ~2% power efficiency. Embodiments of the disclosure may improve the amplifier's power efficiency, for example, by pre-distorting a radio frequency (RF) signal to compensate for the conventional amplifier's non-linearity so that the conventional amplifier may be over-drive or to reduce the conventional amplifier's bias to improve the conventional amplifier's power efficiency.

FIG. 1 is a block diagram of a digital pre-distortion system 100 for providing digital pre-distortion consistent with embodiments of the disclosure. As shown in FIG. 1, digital pre-distortion system 100 may comprise a digital pre-distortion actuator 105, an amplifier component 110, a first computing component 115, a first time delay element 120, a second computing component 125, and a second time delay element 130. Digital pre-distortion actuator 105 may comprise a pre-distorter 135 and an inverting network 140. Amplifier component 110 may comprise input matching circuitry 145, amplifier 150, and output matching circuitry 155. While FIG. 1 shows a plurality of separate elements, these elements and the functionality of these elements may be combined or separated in any way.

Input matching circuitry 145 may comprise any circuitry used to match an input source to a node comprising amplifier component 110. For example, if the input comprises a 50 ohm or 75 ohm coaxial cable, input matching circuitry 145 may match the input 50 ohm or 75 ohm coaxial cable. Amplifier 150 may comprise, for example, a Class-A amplifier. In a Class-A amplifier, 100% of the input signal may be used (i.e., conduction angle=360°). An active element in a Class-A amplifier may remain conducting all of the time for example. Similar to input matching circuitry 145, output matching circuitry 155 may comprise any circuitry used to match an output source to the node comprising amplifier component 110. For example, if the output comprises a 50 ohm or 75 ohm coaxial cable, output matching circuitry 155 may match the output 50 ohm or 75 ohm coaxial cable.

Each of these aforementioned elements in FIG. 1 may be embodied in hardware and/or in software (including firmware, resident software, micro-code, etc.) or in any other circuits or systems. For example, the aforementioned elements in FIG. 1 may be practiced in an electrical circuit comprising discrete electronic elements, packaged or integrated electronic chips containing logic gates, a circuit utilizing a microprocessor, or on a single chip containing electronic elements or microprocessors. Furthermore, the aforementioned elements in FIG. 1 may also be practiced using other technologies capable of performing logical operations such as, for example, AND, OR, and NOT, including but not limited to, mechanical, optical, fluidic, and quantum technologies. The aforementioned elements in FIG. 1 may be practiced in a computing device 500 as described in greater detail below with respect to FIG. 5.

The input signal (i.e., tx_rf0) may comprise an RF signal that may be received by pre-distorter 135. Pre-distorter 135 may pre-distort the received RF signal to compensate for amplifier 150's non-linearity. The pre-distorted RF signal may then be received by inverting network 140 that may compensate for any undesired channel effects that may be imposed by input matching circuitry 145. After digital pre-distortion actuator 105 compensates the input signal for amplifier 150's non-linearity and for input matching circuitry 145's undesired channel effects, the signal may be passed to amplifier component 110 where amplifier 150 may amplify the received signal. The amplified signal may then be passed from output matching circuitry 155 as the output signal (i.e., tx_rf). Accordingly, embodiments of the disclosure may improve amplifier 150's power efficiency, for example, by pre-distorting the input signal (i.e., tx_rf0) to compensate for amplifier 150's non-linearity so that amplifier 150 may be over-drive or to reduce amplifier 150's bias to improve amplifier 150's power efficiency.

Figure 2:
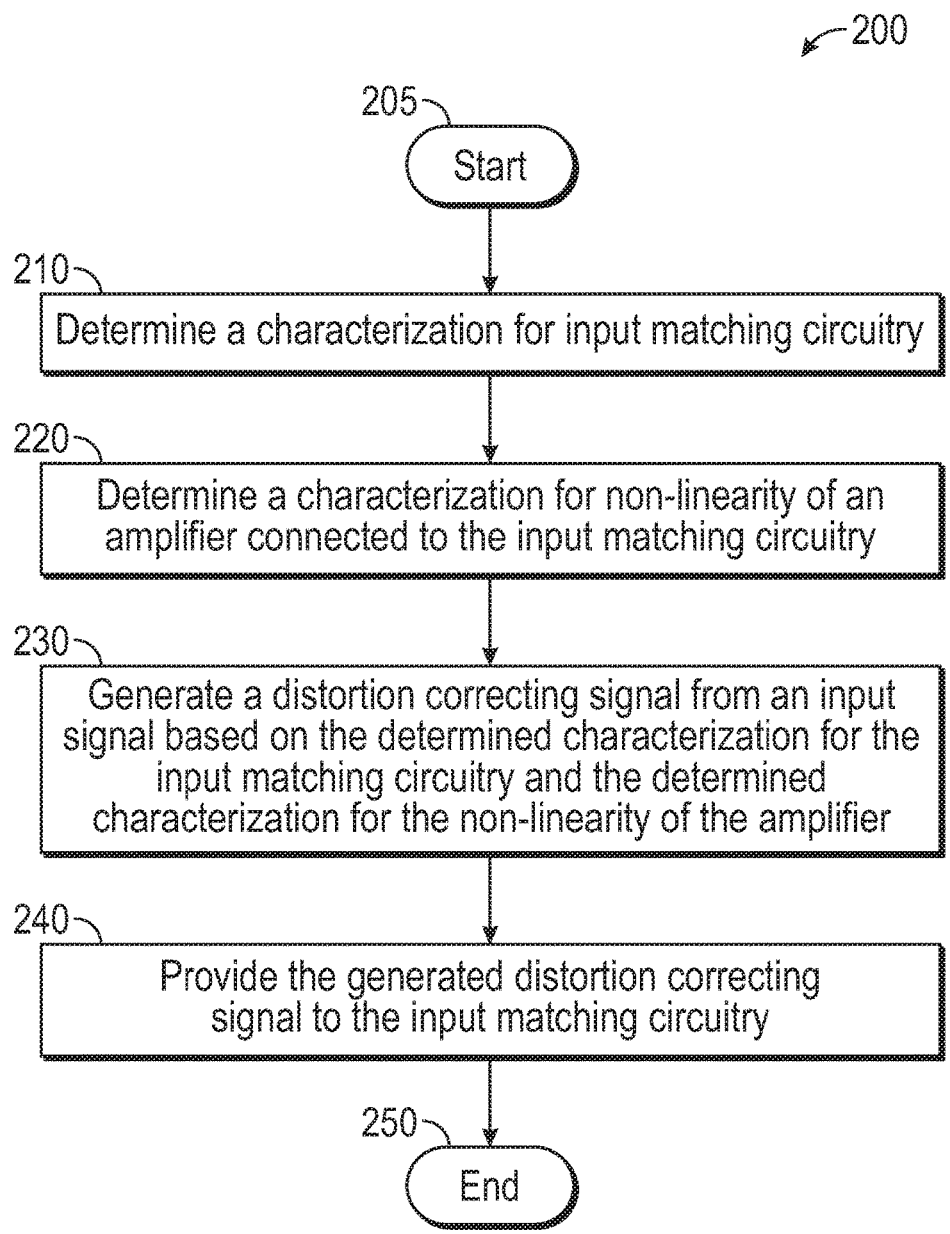
FIG. 2 is a flow chart of a method for providing digital pre-distortion.

FIG. 2 is a flow chart setting forth the general stages involved in a method 200 consistent with an embodiment of the disclosure for providing digital pre-distortion. Method 200 may be implemented using digital pre-distortion actuator 105, first computing component 115, and second computing component 125 as described in more detail below with respect to FIG. 1. Ways to implement the stages of method 200 will be described in greater detail below.

Method 200 may begin at starting block 205 and proceed to stage 210 where pre-distortion system 100 may determine a characterization for input matching circuitry 145. For example, digital pre-distortion actuator 105 may perform an iterative process to find amplifier 150's non-linearity (i.e., f(.)) and the characterization (i.e., H1) for input matching circuitry 145 between digital pre-distortion actuator 105 and amplifier 150, so pre-distortion actuator 105 may cancel out f(.).

First, second computing component 125 may use tx_rf0 (i.e., the input signal) as a reference and tx_rf (i.e., the output signal) as an observation to compute W. W may be a computed version of H1 (i.e., the characterization for input matching circuitry 145). Next, pre-distortion system 100 may apply W to tx_rf0 to synchronize tx_rf0 with tx_rf. The synchronize version of tx_rf0 may be denoted as tx_rf0a. Then pre-distortion system 100 may compute digital pre-distortion coefficients for $f(.)^{-1}$ from tx_rf0a and tx_rf. These coefficients may be updated at each iteration in a Look Up Table (LUT) defining $f(.)^{-1}$. The distortion correcting signal (i.e., tx_rf1) may be computed from tx_rf0 using the current coefficients for $f(.)^{-1}$ (e.g., from the LUT) and W1. This W1 may be from a previous iteration. Next, first computing component 115 may then use tx_rf as a reference and tx_rf1 as an observation to compute W1. W1 may comprise $H^{-1}$, which may be a calculated inverse of H1 (i.e., an inverse of the characterization for input matching circuitry 145). The previous version of W1 may be updated with this current version of W1 and the iterative process may be repeated.

From stage 210, where pre-distortion system 100 determines the characterization for input matching circuitry 145, method 200 may advance to stage 220 where pre-distortion system 100 may determine a characterization for non-linearity of amplifier 150 (i.e., f(.)) connected to input matching circuitry 145. For example, as stated above, pre-distortion system 100 may compute digital pre-distortion coefficients for $f(.)^{-1}$ from tx_rf0a and tx_rf. These coefficients may be updated at each iteration in the LUT defining $f(.)^{-1}$.

Once second pre-distortion system 100 determines the characterization for non-linearity of amplifier 150 connected to input matching circuitry 145 in stage 220, method 200 may continue to stage 230 where digital pre-distortion actuator 105 may generate the distortion correcting signal (i.e., tx_rf1) from the input signal (i.e., tx_rf0) based on the determined characterization for input matching circuitry 145 and the determined characterization for the non-linearity of amplifier 150. For example, the distortion correcting signal (i.e., tx_rf1) may be computed from tx_rf0 using the current coefficients for $f(.)^{-1}$ (e.g., from the LUT) and W1. This W1 may be from a previous iteration.

After digital pre-distortion actuator 105 generates the distortion correcting signal from the input signal based on the determined characterization for input matching circuitry 145 and the determined characterization for the non-linearity of amplifier 150 in stage 230, method 200 may proceed to stage 240 where digital pre-distortion actuator 105 may provide the generated distortion correcting signal to input matching circuitry 145. For example, the generated distortion correcting signal (i.e., tx_rf1) may be passed from digital pre-distortion actuator 105 to input matching circuitry 145 in amplifier component 110. Once digital pre-distortion actuator 105 provides the generated distortion correcting signal to input matching circuitry 145 in stage 240, method 200 may then end at stage 250.

Figure 3:
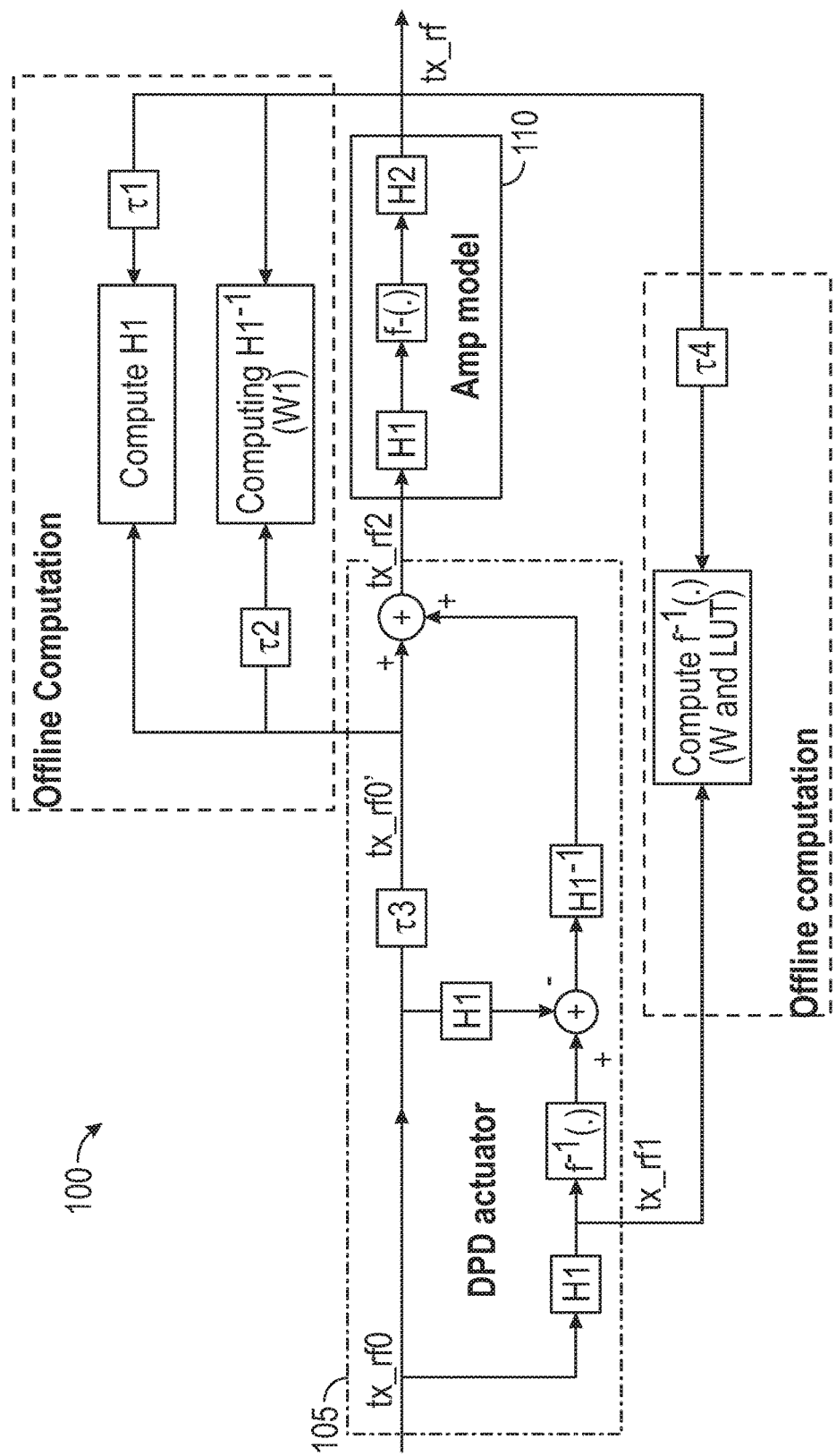
FIG. 3 is a block diagram of a digital pre-distortion system.

FIG. 3 shows digital pre-distortion system 100. As shown in FIG. 3, tx_rf1 may equal the convolution of tx_rf0 and H1 (e.g., Conv (tx_rf0, H1)). To obtain tx_rf0', tx_rf0' may equal tx_rf0(t-t3) (i.e., delay tx_rf0 by t3). To obtain H1, tx_rf0' may be used as the reference and tx_rf as the observation. For example, t1 may be selected so the observation may be delayed by 16 samples with respect to the reference. To obtain $H^{-1}$, tx_rf may be used as the reference and tx_rf0' may be used as the observation. For example, t2 may be selected so the observation may be delayed by 16 samples with respect to the reference and t3 may equal t1+t2. Coefficients for $f^{-1}(.)$ and W may be obtained by using tx_rf1 as the reference and tx_rf as the observation. For example, t4 may be selected so the observation may be delayed by 16 samples with respect to the reference (e.g., the number of the taps in reference may be 36). So the process in FIG. 3 may be to: i) compute H1, $H1^{-1}$, and t3; ii) compute W and coefficients for $f^{-1}(.)$ based on the computed H1, $H1^{-1}$; and t3; iii) repeat i) and ii).

Figure 4:
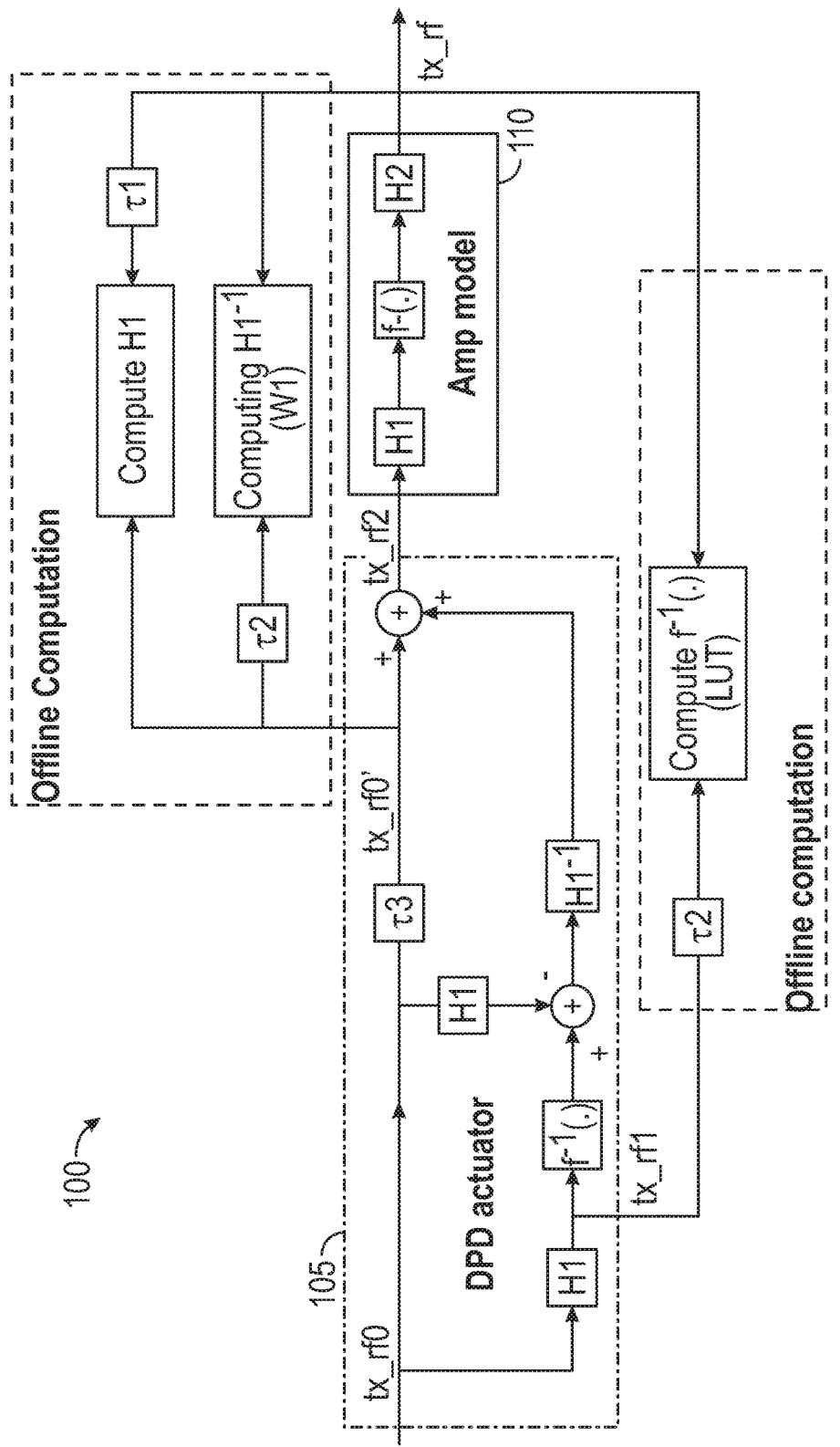
FIG. 4 is a block diagram of a digital pre-distortion system.

FIG. 4 shows digital pre-distortion system 100. As shown in FIG. 3, tx_rf1 may equal the convolution of tx_rf0 and H1 (e.g., Conv (tx_rf0, H1)). To obtain tx_rf0', tx_rf0' may equal tx_rf0(t-t3) (i.e., delay tx_rf0 by t3). To obtain H1, tx_rf0' may be used as the reference and tx_rf as the observation. For example, t1 may be selected so the observation may be delayed by 16 samples with respect to the reference. To obtain $H^{-1}$, tx_rf may be used as the reference and tx_rf0' as the observation. For example, t2 may be selected so the observation is delayed by 16 samples with respect to the reference and t3 may equal t1+t2. Coefficients for $f^{-1}(.)$ may be obtained by using tx_rf1 as the reference and tx_rf as the observation. For example, tx_rf1 may be delayed by t2 so the reference may be aligned with the observation in time (e.g., the number of the taps in reference may be 36). So the process in FIG. 3 may be to: i) compute H1, $H1^{-1}$, and t3; ii) delay tx_rf1 by t2; iii) compute coefficients for $f^{-1}(.)$ based on the computed H1, $H1^{-1}$, and t3; iv) repeat i), ii) and iii)).

Figure 5:
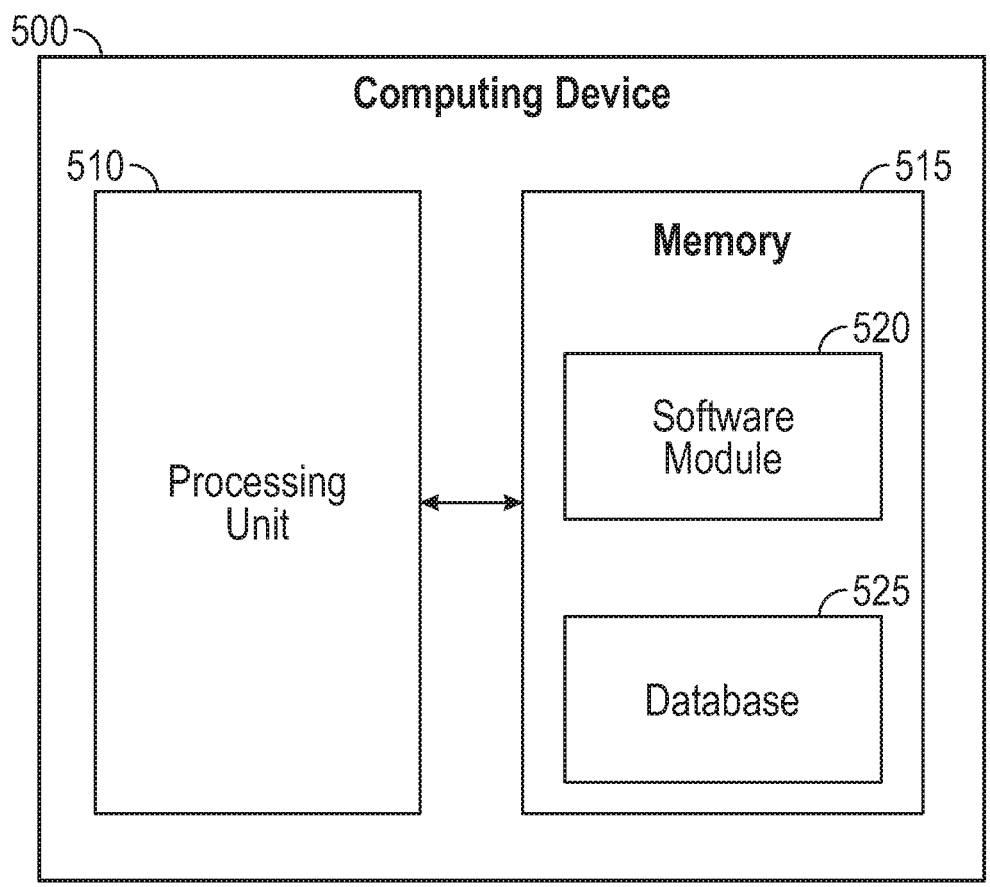
FIG. 5 is a block diagram of a computing device.

FIG. 5 shows computing device 500. As shown in FIG. 5, computing device 500 may include a processing unit 510 and a memory unit 515. Memory unit 515 may include a software module 520 and a database 525. While executing on processing unit 510, software module 520 may perform, for example, processes for providing digital pre-distortion, including for example, any one or more of the stages from method 200 described above with respect to FIG. 2. Computing device 500, for example, may provide an operating environment for any one or more of the elements shown in FIG. 1, FIG. 3, or FIG. 4. Any one or more of the elements shown in FIG. 1, FIG. 3, or FIG. 4 may operate in other environments and are not limited to computing device 500.

Computing device 500 may be implemented using a Wireless Fidelity (Wi-Fi) access point, a cellular base station, a tablet device, a mobile device, a smart phone, a telephone, a remote control device, a set-top box, a digital video recorder, a cable modem, a personal computer, a network computer, a mainframe, a router, a switch, a server cluster, a smart TV-like device, a network storage device, a network relay devices, or other similar microcomputer-based device. Computing device 500 may comprise any computer operating environment, such as hand-held devices, multiprocessor systems, microprocessor-based or programmable sender electronic devices, minicomputers, mainframe computers, and the like. Computing device 500 may also be practiced in distributed computing environments where tasks are performed by remote processing devices. The aforementioned systems and devices are examples and computing device 500 may comprise other systems or devices.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Further, the disclosed methods' stages may be modified in any manner, including by reordering stages and/or inserting or deleting stages, without departing from the disclosure.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to, mechanical, optical, fluidic, and quantum technologies. In addition, embodiments of the disclosure may be practiced within a general purpose computer or in any other circuits or systems.

Embodiments of the disclosure may be practiced via a system-on-a-chip (SOC) where each or many of the components illustrated in FIG. 1 may be integrated onto a single integrated circuit. Such an SOC device may include one or more processing units, graphics units, communications units, system virtualization units and various application functionality all of which may be integrated (or "burned") onto the chip substrate as a single integrated circuit. When operating via an SOC, the functionality described herein with respect to embodiments of the disclosure, may be performed via application-specific logic integrated with other components of computing device 500 on the single integrated circuit (chip).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. A method comprising:
    determining a characterization for input matching circuitry, wherein determining the characterization for the input matching circuitry comprises comparing an input signal to an output signal;
    determining a characterization for non-linearity of an amplifier connected to the input matching circuitry; and
    generating a distortion correcting signal from the input signal based on the determined characterization for the input matching circuitry and the determined characterization for the non-linearity of the amplifier.

2. The method of claim 1, further comprising providing the generated distortion correcting signal to the input matching circuitry.

3. The method of claim 1, wherein determining the characterization for non-linearity of the amplifier comprises:
    determining a synchronized version of the input signal by applying the characterization for the input matching circuitry to the input signal; and
    determining the characterization for non-linearity of the amplifier based on the synchronized version of the input signal and an output signal.

4. The method of claim 3, wherein determining the characterization for non-linearity of the amplifier comprises:
    determining Digital Pre-Distortion (DPD) coefficients from the synchronized version of the input signal and the output signal; and
    updating a Look Up Table (LUT) with the determined DPD coefficients.

5. The method of claim 1, wherein determining the characterization for non-linearity of the amplifier comprises determining the characterization for non-linearity of the amplifier wherein the amplifier is disposed in a Hybrid Fiber-Coaxial (HFC) network.

6. The method of claim 1, wherein generating the distortion correcting signal comprises generating the distortion correcting signal by a Digital Pre-Distortion actuator.

7. A non-transitory computer-readable medium that stores a set of instructions which when executed perform a method comprising:
    determining a characterization for input matching circuitry, wherein determining the characterization for the input matching circuitry comprises comparing an input signal to an output signal;
    determining a characterization for non-linearity of an amplifier connected to the input matching circuitry; and
    generating a distortion correcting signal from the input signal based on the determined characterization for the input matching circuitry and the determined characterization for the non-linearity of the amplifier.

8. The non-transitory computer-readable medium of claim 7, further comprising providing the generated distortion correcting signal to the input matching circuitry.

9. The non-transitory computer-readable medium of claim 7, wherein determining the characterization for non-linearity of the amplifier comprises:
    determining a synchronized version of the input signal by applying the characterization for the input matching circuitry to the input signal; and
    determining the characterization for non-linearity of the amplifier based on the synchronized version of the input signal and an output signal.

10. The non-transitory computer-readable medium of claim 9, wherein determining the characterization for non-linearity of the amplifier comprises:
    determining Digital Pre-Distortion (DPD) coefficients from the synchronized version of the input signal and the output signal; and
    updating a Look Up Table (LUT) with the determined DPD coefficients.

11. The non-transitory computer-readable medium of claim 7, wherein determining the characterization for non-linearity of the amplifier comprises determining the characterization for non-linearity of the amplifier wherein the amplifier is disposed in a Hybrid Fiber-Coaxial (HFC) network.

12. The non-transitory computer-readable medium of claim 7, wherein generating the distortion correcting signal comprises generating the distortion correcting signal by a Digital Pre-Distortion actuator.

13. A system comprising:
    a memory storage; and
    a processing unit coupled to the memory storage, wherein the processing unit is operative to:
        determine a characterization for input matching circuitry, wherein the processing unit being operative to determine the characterization for the input matching circuitry comprises the processing unit being operative to compare an input signal to an output signal;
        determine a characterization for non-linearity of an amplifier connected to the input matching circuitry; and
        generate a distortion correcting signal from the input signal based on the determined characterization for the input matching circuitry and the determined characterization for the non-linearity of the amplifier.

14. The system of claim 13, wherein the processing unit is further operative to provide the generated distortion correcting signal to the input matching circuitry.

15. The system of claim 13, wherein the processing unit being operative to determine the characterization for non-linearity of the amplifier comprises the processing unit being operative to:
    determine a synchronized version of the input signal by applying the characterization for the input matching circuitry to the input signal; and
    determine the characterization for non-linearity of the amplifier based on the synchronized version of the input signal and an output signal.

16. The system of claim 15, wherein the processing unit being operative to determine the characterization for non-linearity of the amplifier comprises the processing unit being operative to:
    determine Digital Pre-Distortion (DPD) coefficients from the synchronized version of the input signal and the output signal; and
    update a Look Up Table (LUT) with the determined DPD coefficients.

17. The system of claim 13, wherein the amplifier is disposed in a Hybrid Fiber-Coaxial (HFC) network.

* * * * *